(12) United States Patent
Kellam et al.

(10) Patent No.: US 9,564,225 B2
(45) Date of Patent: ***Feb. 7, 2017

(54) PULSE CONTROL FOR NON-VOLATILE MEMORY

(71) Applicant: Rambus Inc., Sunnyvale, CA (US)

(72) Inventors: Mark D. Kellam, Siler City, NC (US); Brent Steven Haukness, Monte Sereno, CA (US); Gary B. Bronner, Los Altos, CA (US); Kevin Donnelly, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/878,902

(22) Filed: Oct. 8, 2015

(65) Prior Publication Data

US 2016/0027515 A1     Jan. 28, 2016

Related U.S. Application Data

(63) Continuation of application No. 14/145,962, filed on Jan. 1, 2014, now Pat. No. 9,177,655, which is a (Continued)

(51) Int. Cl.
*G11C 16/10*     (2006.01)
*G11C 16/12*     (2006.01)
(Continued)

(52) U.S. Cl.
CPC ........... *G11C 16/10* (2013.01); *G11C 16/0408* (2013.01); *G11C 16/12* (2013.01); *G11C 16/26* (2013.01); *G11C 16/3459* (2013.01)

(58) Field of Classification Search
CPC ...... G11C 16/10; G11C 16/3459; G11C 16/12
See application file for complete search history.

(56) References Cited

U.S. PATENT DOCUMENTS

| 5,680,348 A | 10/1997 | Chung et al. |
| 5,856,946 A | 1/1999 | Chan et al. |

(Continued)

OTHER PUBLICATIONS

Chimenton et al. "Ultra-Short Pulses Improving Performance and Reliability in Flash Memories," IEEE Non-Volatile Semiconductor Memory Workshop, Feb. 12-16, 2006, New York, pp. 46-47. 2 pages.

(Continued)

*Primary Examiner* — Vanthu Nguyen
(74) *Attorney, Agent, or Firm* — Marc P. Schuyler (57) ABSTRACT

A nonvolatile memory device that uses pulsed control and rest periods to mitigate the formation of defect precursors. A first embodiment uses pulsed bitline control, where the coupling between a memory cell channel and a reference voltage is pulsed when it is desired to change state in the associated memory cell. Each pulse may be chosen to be less than about 20 nanoseconds, while a "rest period" between pulses can be on the order of about a hundred nanoseconds or greater. Because bitline control is used, very short rise times can be enabled, enabling generation of pulse durations of 50 nanoseconds or less. In other embodiments, these methods may also be more generally applied to other conductors (e.g., wordline or substrate well, for program or erase operations); segmented wordlines or bitlines may also be used, to minimize RC loading and enable sufficiently short rise times to make pulses robust.

18 Claims, 5 Drawing Sheets

Related U.S. Application Data continuation of application No. 13/146,521, filed as application No. PCT/US2010/022605 on Jan. 29, 2010, now Pat. No. 8,644,078.

(60) Provisional application No. 61/163,001, filed on Mar. 24, 2009.

(51) Int. Cl.
*G11C 16/34* (2006.01)
*G11C 16/04* (2006.01)
*G11C 16/26* (2006.01)

(56) References Cited

U.S. PATENT DOCUMENTS

| | | | |
|---|---|---|---|
| 6,067,253 A | 5/2000 | Gotou | |
| 6,721,204 B1 | 4/2004 | Yeh et al. | |
| 7,190,614 B2 | 3/2007 | Wu | |
| 7,212,446 B2 | 5/2007 | Diorio et | |
| 7,339,834 B2 | 3/2008 | Lutze | |
| 7,561,471 B2 | 7/2009 | Park et al. | |
| 7,633,803 B2 | 12/2009 | Lee | |
| 7,692,971 B2 | 4/2010 | Moschiano et al. | |
| 8,432,102 B2 | 4/2013 | Terlizzi et al. | |
| 2006/0203587 A1 | 9/2006 | Li et al. | |
| 2008/0080256 A1 | 4/2008 | Kuramori | |
| 2008/0181008 A1* | 7/2008 | Lee | G11C 16/20 365/185.17 |
| 2008/0232169 A1 | 9/2008 | Frulio et al. | |
| 2009/0067246 A1 | 3/2009 | Walker | |

OTHER PUBLICATIONS

International Search Report and Written Opinion with mail date of Sep. 13, 2010 in International Application No. PCT/US2010/022605. 10 pages.

Irrera et al., "Reliability Improvements in 50nm MCL NAND Flash Memory Using Short Voltage Programming Pulses," Microelectronics Reliability, Feb. 2009, pp. 135-138. 4 pages.

* cited by examiner

PULSE CONTROL FOR NON-VOLATILE MEMORY

This disclosure claims priority to each of the following patent applications: U.S. Provisional Patent Application No. 61/163,001 for "Pulse Control For NonVolatile Memory," filed on behalf of first named inventor Mark D. Kellam on Mar. 24, 2009; P.C.T. Patent Application No. PCT/US2010/022605 for "Pulse Control For NonVolatile Memory," filed on behalf of first named inventor Mark D. Kellam on Jan. 29, 2010; U.S. patent application Ser. No. 13/146,521 for "Pulse Control For NonVolatile Memory," filed on behalf of first named inventor Mark D. Kellam on Jul. 27, 2011 (now U.S. Pat. No. 8,644,078, said application being a national stage entry of the aforementioned P.C.T. patent application); and U.S. patent application Ser. No. 14/145,962 for "Pulse Control For NonVolatile Memory," filed on behalf of first named inventor Mark D. Kellam on Jan. 1, 2014. Each of the aforementioned patent applications is hereby incorporated by reference.

BACKGROUND

Nonvolatile memory can retain stored information without the continual requirement of short-interval refresh operations, i.e., such that memory contents can be retained in the absence of external power for at least as long as typical on/off times of electronic devices; for these reasons, nonvolatile memory can save power, enable new applications and further extend functionality of portable devices.

To date, one of the most cost-effective forms of nonvolatile memory is flash memory, which unfortunately suffers from use-based degradation. That is to say, flash memory in particular eventually loses its ability to retain information for any length of time, with current expected lifetime being about 10,000-100,000 read and write cycles. It is believed that one primary cause of this life cycle wear is damage to the oxide layers in these devices from the formation of traps that arise under the influence of high electromagnetic fields used in programming ("setting") and erasing ("resetting") of device memory cells. Although the physics associated with trap formation are not precisely understood, it is believed that these traps are the result of precursors, which form and develop over short periods of time to ultimately become permanent. Life cycle wear is a significant limitation for nonvolatile memory, and has generally inhibited application of flash memory in environments calling for high read and write turnover (e.g., main memory for portable computers).

A need exists for ways of minimizing this damage, so as to extend the useful life of nonvolatile memory, reduce maintenance, and enable new applications. The present invention satisfies these needs and provides further, related advantages.

BRIEF DESCRIPTION OF THE DRAWINGS

FIG. 3 is a block diagram of a method of pulsing the flow of current through nonvolatile memory cells. The method may be applied, for example, to control the charging of the floating gates 115 of selective memory cells in FIG. 1 during state change operations. Dashed-line boxes at the right side of FIG. 3 illustrate various types of "control information" that determine pulse parameters. In some embodiments, several of these information types may be used and, if desired, these may be the subject of dynamic (i.e., run-time) adjustment.

FIG. 4 is a timing diagram of an example of pulsed bitline control. In particular, a first signal 403 represents wordline voltage, while a second signal 405 represents the switching of a substrate channel between two voltages (e.g., between "$V_{cc}$" and ground). The voltage across a memory cell is indicated by numeral 407, and includes an "on" period defined by numeral 411 and a "rest period" identified by numeral 413. A number of pulses "N" is applied as may be desired to ensure proper state change or conditioning operations.

DETAILED DESCRIPTION

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies (i) a method of controlling a nonvolatile memory cell in a manner that deliberately applies voltages in the form of multiple pulses, each having short rise time, and (ii) a device based on such a method, implemented for example as a flash memory device. The invention, however, may also be applied to other methods and devices as well.

I. INTRODUCTION

Oxide layer reliability is of extreme importance in the longevity of many semiconductor devices, among them nonvolatile memory cells, capacitors, DRAM cells and other electronic components. In the context of nonvolatile memory cells, charge may be transferred to and from a charge storage structure (usually a floating gate or charge storage layer) through an oxide layer, for example, through a tunneling process such as Fowler-Nordheim tunneling. Because high electric fields can degrade the oxide layer, the oxide layer can be damaged over time, ultimately affecting the ability of nonvolatile memory cells to "set" and "reset." Designs presented by this disclosure therefore attempt to mitigate the damage caused by these high electric fields—by spreading the transfer of charge through the oxide layer into discrete pulses, with annealing times therebetween, trap degradation can potentially be reduced. The reduction of defect formation under these pulsed state change conditions is modeled as a two step process. A defect precursor may be formed during the stress condition that requires some time to transform into the final defect structure (e.g., a trap). The defect structure is stable and difficult to anneal or repair, but the defect precursors may be removed or annealed if the stress condition is removed for a periodic "resting" between periods of stress. The retardation of defect formation is thus enhanced when the periods of stress are short and the rest periods are long. That is to say, it is believed that interrupting the transfer of charge, if done in a manner to attack the precursor formation, may help minimize life cycle damage.

It is difficult to generate discrete pulses that are effective for these purposes, especially for arrays which are divided into pages of many thousands of cells that are programmed or erased as a unit (e.g., flash memory cells and SONOS cells). The loading provided by internal conductor routing and transistors used in these designs result in slow pulse rise times, making it difficult to generate short term, discrete pulses; that is to say, the rise times for voltage pulses used for programming and erasing of these memory types is sufficiently slow that it is difficult to generate high-voltage, short term pulses that can be effectively used to retard defect formation during memory cell state change operations.

Embodiments discussed below are therefore directed to structures that apply a series of short rise time voltage pulses across the oxide layer of a memory cell. By shortening the interval over which these currents are applied, ideally to pulses of no more than about 20-50 nanoseconds for some of today's nonvolatile memory devices, and allowing precursors to anneal (i.e., to "heal") before renewed application of the electric fields and associated currents, trap formation can be minimized, thereby enhancing device lifetime. As precursors heal, voltage can then be applied in one or more discrete pulses to continue transferring charge until a charge storage structure (e.g., floating gate or charge storage layer) experiences sufficient charge transfer.

In a first implementation, bitline control is employed to apply these pulses.

In a second implementation, control for a memory array is divided up so as to significantly reduce loading issues. With loading reduced to a manageable level, to enable specific maximum voltage pulse rise times, voltage pulses can be applied to any desired conductor, including to a wordline, bit line, substrate well, or other pertinent conductor. Specific segmented driver mechanisms will be discussed which enable this type of control. In each of these implementations, the total charge transferred to or from a charge storage device can be the same as is conventional, but with charge transfer broken up as a discrete series of pulses, separated by a rest period of sufficient duration to mitigate permanent trap formation.

It is believed that through the embodiments proposed below, memory life may be significantly extended, by suppressing defect formation associated with typical conditioning or memory state change operations.

The embodiments discussed below are primarily couched in terms of flash memory, NAND flash memory in particular, but the teachings of this disclosure may be applied to other forms of memory. For example, a number of designs for nonvolatile memories have been proposed, including designs based on other technologies. Although known by a wide number of acronyms and names, these designs usually are based on a material (usually a metal or semiconductor) that reversibly changes a physical or electrical state under the application of a voltage, field, current, or other effect; the state can be nondestructively sensed, thereby permitting use of the state for information storage. It should be possible to apply teachings from this disclosure to these other nonvolatile memory forms as well.

II. BITLINE CONTROL

A. Memory Cell Structure and Associated States.

A first embodiment presented by this disclosure provides a method of controlling a bitline of a memory cell in order to limit electric field times so as to inhibit defect formation; an associated structure is also provided. The design philosophy adopted by embodiments based on bitline control is that wordline voltage should be held relatively constant (e.g., wordline control separated from application of a multiple pulses to effectuate a single program cycle) and a bitline should be pulsed between ground and another reference voltage to turn off programming (or other voltage activities) and provide a rest state. Because a bitline presents reduced loading issues relative to other conductors in a flash memory device (as the bitline is typically fabricated from a metal, e.g., copper), pulsed operations discussed herein may be effectively applied to substantially shorten pulse rise time. Simply stated, using bitline control helps facilitate short duration voltage pulses, potentially enabling the generation of pulses of 20-50 nanoseconds or less. The specific design of an array, so as to provide specific rise time criteria associated with bitline voltage pulses, will be discussed further below.

Figure 1:
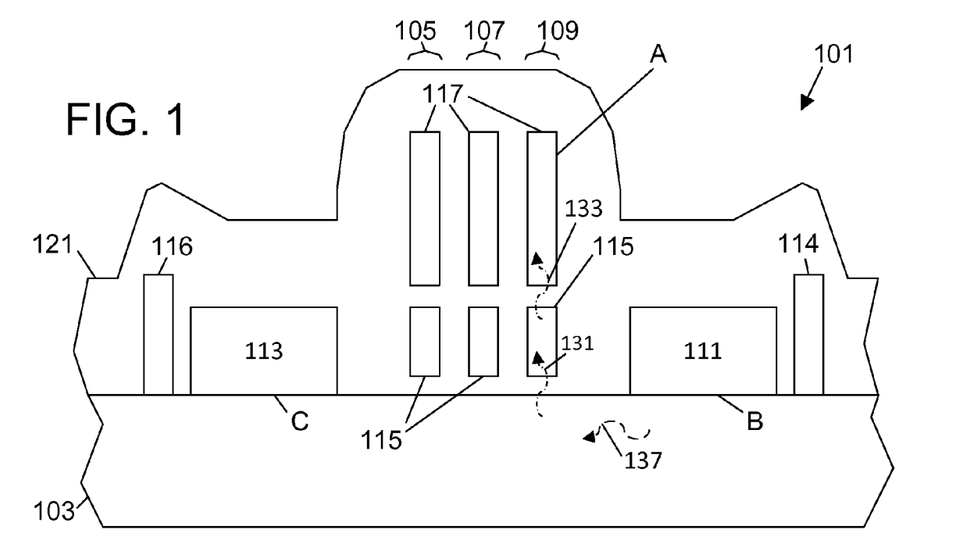
FIG. 1 is a cross-sectional diagram of a group of three memory cells 105, 107 and 109, arranged as part of a string of memory cells. While only three memory cells are illustrated, it should be understood that a typical string might consist of thirty-two, sixty-four or some other number of memory cells. The cells illustrated are nonvolatile memory cells and, in particular, flash memory cells. In conjunction with the example of FIG. 1, it is desired to charge a floating gate 115 of one or more memory cells in the string in order to "program" (or "set") those cells, or alternatively, to remove charge from the floating gate 115 and thereby "erase" (or "reset") those cells.

FIG. 1 shows a flash memory structure 101 that includes a substrate 103 and a group of three memory cells 105, 107 and 109, arranged as part of a string of memory cells in a NAND flash cell structure. Each string is served by a common bit line that is coupled to a channel defined by the substrate 103. FIG. 1 in fact illustrates a simplified cross-section of a memory array, meaning that while only three memory cells are illustrated, a typical string might consist of thirty-two, sixty-four or some other number of memory cells. The cells illustrated in FIG. 1 are adjacent to (i.e., next to) each other within the same string. Each string effectively forms a structure that flows current through the substrate from a first access transistor 111 to a second access transistor 113. The first access transistor 111 effectively couples the bitline to the channel (i.e., to the substrate) through a bitline contact 114 to gate the flow of charge into the substrate (that is, the substrate channel), while the second access transistor selectively couples the channel to a ground connection through point 116, for use in read and verify operations. Each memory cell structure is effectively itself also a transistor structure with control gate 117 controlling whether the transistor is conducting, dependent on the amount of charge stored on floating gates 115 (which sets the effective threshold voltage of the memory cells 105, 107, and 109). To set or reset the memory cell (i.e., to program the cell to a state or erase that state), the cell is controlled in a manner that isolates charge on the floating gate, such that charge can be retained even in the absence of a power supply.

In the structure depicted in FIG. 1, device state and operation can be explained with reference to three control points used for operations involving each memory cell. The three control points include (a) the substrate (via the two access transistors and a mechanism to selectively charge the substrate), (b) the floating gate, and (c) the control gate. To program or erase the cell (i.e., to "set" or "reset" the cell), a current is caused to flow to either store charge within the floating gate or remove charge from the floating gate, with the stored charge indicating the logic state of the cell; the substrate and the control gate are used as voltage terminals that can be used to change the state of the associated memory cell. By applying a voltage difference that causes electrons to tunnel from the substrate to the floating gate (e.g., by applying a positive voltage to the control gate with a grounded substrate), electrons are stored on the floating gate to thereby program the memory cell. By applying voltage opposite in polarity, charge is effectively removed from the floating gate, to thereby erase (or "reset") the cell.

The illustrated cells are in fact part of a large array consisting of many thousands of cells, the cells each organized into "pages" of memory that are read, programmed and erased together. That is to say, each control gate 117 is coupled to a "wordline" that extends into and out of the page of FIG. 1, where the wordline is coupled to control gates of a memory cell in parallel strings of memory cells (only one of these strings is depicted in FIG. 1), usually on the order of a large number such as 32,768 or more strings; this entire slice, or "page" would be read, programmed or erased as a single unit. In addition to the mentioned structures, FIG. 1 also illustrates an encapsulation layer 121. While a flash structure is illustrated, there are a number of other similar structures that use a charge storage element or region in the same manner as the floating gate described above, for example, a silicon-oxide-nitride-oxide-silicon structure, also called a "SONOS" structure.

Before programming, the second access transistor 113 is turned "off" (i.e., at point "C"). The gate of the first access transistor 111 is connected to a positive voltage (e.g. "$V_{cc}$") so that the channel of each string of memory cells will be selectively coupled to an associated bitline, via bitline contact 114. Each bitline contact will in turn will be either connected to a positive voltage (e.g. "$V_{cc}$") if programming is to be inhibited on that bitline string or to ground if the memory cells within the string are to be programmed (or "set"). Setting the bitline contact voltage to the same positive value as the access transistor gate potential effectively turns off the access transistor and isolates the channel transistors associated with that bitline string from ground. At this time, the wordline representing a page of memory being programmed (i.e., "set"), for example, one bit of which is represented by cell 109, is raised to a programming voltage. In FIG. 1, this programming voltage would be applied at point "A," which couples the floating gate 115 high and causes charge to flow between the substrate and the floating gate (as indicated by arrow 131) and thereby charge the floating gate (if the associated bitline is coupled to ground, i.e., at point "B"). For those bitlines that have been "inhibited" or isolated by turning off their access transistor, the rising wordline voltage induces a rising channel potential through capacitive coupling of the wordlines to the isolated channels. The increase in channel potential for inhibited bitlines reduces the electric fields across the tunneling oxide, and charging of the floating gates 115 for inhibited bitlines is consequently substantially suppressed. The channel potential induced under the inhibited bitlines is dependent on specific geometries and device designs, but typically can rise to 2 to 3 times the inhibited bitline contact potential (e.g. $V_{cc}$) and charging rates of inhibited cells is typically suppressed by a factor of at least $10^6$. After the wordline voltages have been increased and the programming of the grounded bitlines has begun, the rate of programming of cells on a selected bitline can also be suppressed by raising the bitline contact potential from ground to $V_{cc}$. The channel potential will rise to $V_{cc}-V_{th}$ and the charging of the floating gates along this bitline string will be suppressed by a factor of 100 to 1000. This suppression is smaller than that experienced on the inhibited bitlines because the channel voltage increase is not being boosted by a rising voltage on the capacitively-coupled wordlines, however, the reduction in charging current is significant enough to provide a "rest" period for the device being programmed. If the bitline contact potential of a resting device is returned from $V_{cc}$ to ground, the charging of the selected floating gates begins again.

In this regard, the gap 131 and a second gap 133 between the floating gate and substrate can each be modeled as a capacitor—the electric field across these gaps is directly related to the voltage difference at any point in time. As a consequence, when a programming pulse is initially applied to the floating gate, with a substrate held at ground, the electric field is immediately a maximum and begins to decline as the difference in charge between the floating gate and the control gate equalizes. Large electric fields are observed in the gaps between (a) the control gate 115 and the associated floating gate 117, and (b) the floating gate 117 and a localized area of the substrate 103, but are of concern in the latter gap through which electron tunneling occurs for purposes of charging and discharging the floating gate. In this regard, the oxide between the floating gate and the control gate (i.e., at the gap 131) is usually thicker and may be made from high dielectric constant materials to reduce the tunneling to the control gate. It is within the second gap 133 that large electric fields can primarily cause problems that increase leakage and so affect the ability of a memory cell to set and reset (program/erase) in a repeatable manner. The described behavior of current, electric field and charge is generally described by the Fowler-Nordheim equation for current density, $$J = K_1 \cdot E^2 \exp\left(-\frac{K_2}{E}\right), \quad (1)$$

where "E" is electric field, measured in Volts per unit distance, "J" is current density, and "$K_1$" and "$K_2$" are constants. What this equation indicates is that when a charge difference exists between two surfaces, for example, between a control gate and its associated floating gate 115/117 or between a floating gate and adjacent substrate 115/103, current generally varies with both the square of the voltage difference and exponentially as a function of voltage.

The embodiment illustrated in FIG. 1 has the duration of charging or discharging the floating gate deliberately controlled in duration, and separated into multiple, discrete pulses, so that the duration of the generated electric field is limited and the dielectric between the floating gate and the substrate or control gate is allowed to "rest," so as to at least partially anneal or heal defects. That is to say, contrary to conventional wisdom of minimizing program or erase times to emphasize performance, embodiments disclosed herein spread out a program or erase operation into a series of spaced "micropulses," with a substantial rest period in between, to emphasize endurance and reliability by retarding defect formation. There are a number of ways to implement appropriate pulse control, including for those embodiments that use bitline control, by pulsing the bitline contact of the first access transistor 111 to effectively modulate the voltage difference between the control gate and channel of a memory cell in the process of being programmed. As will be further discussed further below, the rise time associated with these pulses can also be enhanced by minimizing bit line routing and effectively subdividing each bitline into a series of individually driven segments (of shorter length).

To program a memory cell using a pulsed bitline, the control gate voltage for each memory cell may be raised to "$V_{pass}$," and the control gate for each memory cell in a page undergoing programming may be further then raised from "$V_{pass}$" to a relatively higher voltage "$V_{prog}$" (approximately double "$V_{pass}$") During this process, for any memory cell in that page that is to be programmed, the corresponding bitline is then pulsed "on" for a relatively short period (e.g., 20 nanoseconds) to connect the corresponding substrate channel to ground for this period and "off" for a relatively longer period (e.g., 0.1 to 2.0 microseconds). During this period, current flow diminishes across the dielectric layer between the floating gate 115 and the control gate 117 or substrate 103, respectively, allowing precursor defects to anneal, or partially heal. As will be explained below, depending on the voltage differences at issue (see FIGS. 5 and 6), a sufficiently short pulse duration in connection with a sufficiently large rest period may substantially suppress the ultimate formation of defects. These pulses are controlled to still transfer the same amount of cumulative charge to or from a floating gate as a conventional programming pulse (e.g., a single pulse of a several hundred nanoseconds may be spread out into a ten or more repeated individual pulses of less than fifty nanoseconds each) at the expense of increased program or erase time due to "rest" periods intervening between these micropulses.

Figure 2:
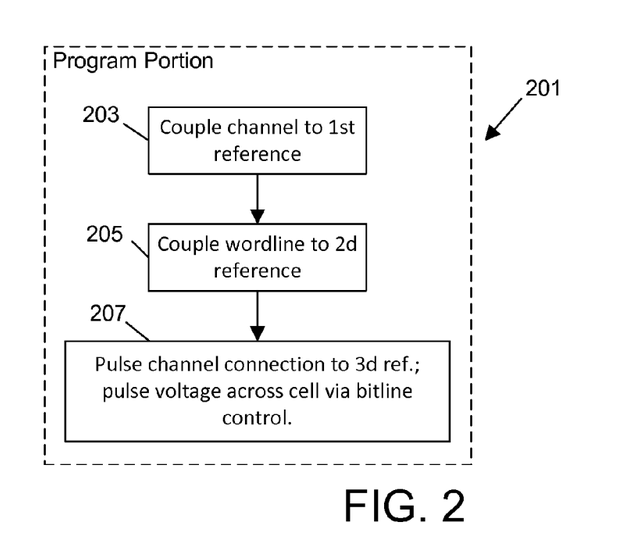
FIG. 2 is a block diagram of a method of pulsed bitline control within a memory cell. The method may be applied, for example, to control the rate at which the floating gates 115 of selective memory cells in FIG. 1 are charged. By pulsing the current flows and allowing the oxide layer to rest before renewed application of voltage, the method of FIG. 2 helps minimize the formation of precursors, and provides the ability to anneal (i.e., reduce or eliminate) precursors in between pulses.

FIG. 2 presents additional detail on a method of pulsed bitline control within a memory cell, for example, to set or reset the state of that memory cell. The method of FIG. 2 may if desired be implemented as part of a single "program pulse" of a multiple-cycle state change operation (known as a "PV" operation). Multiple cycles are frequently used for these operations, because (a) design constraints are such that multiple cells must be programmed or erased as a unit, and (b) silicon variations amongst the cells are such that each cell will change state under a slightly greater or lesser impetus. To minimize the likelihood of cell damage, many designs operate by attempting a state change for a group of cells by applying a relatively small voltage first, to attempt to change state, and then testing for success of the state change as part of a single PV cycle. If needed, a slightly large voltage is applied in each successive PV cycle to those cells which did not correctly change state the previous iteration, followed by verification, and so on, until every cell in a page or block has the correct state ("set" or "reset"). If at any time, the device reaches a maximum number of cycles or a timeout, the device indicates an error and the block in question may be marked as "bad." To provide some examples of the Voltages in question, the initial programming voltage might be 18 VDC, with pulse magnitude increasing by a half volt each PV cycle up to a maximum of 30 VDC (i.e., twenty-four cycle maximum). [Notably, the term "program" as used in this context should be understood to refer to application of a voltage in a state change operation irrespective of whether cells are in fact being "programmed" or "erased," i.e., the use of the term "program" is not limited to the "setting" of memory cells, but rather, refers to the portion of the PV operation (i.e., the "program portion") where voltage is applied across the memory cell prior to a later attempt to verify cell contents.] Following the "pulse" portion (or program portion) of each PV cycle, affected cells are sensed as part of a verify portion of the operation and checked to determine whether they have assumed the desired state, with additional PV cycles performed as necessary and as permitted (i.e., up to a maximum number of PV cycles).

FIG. 2 provides a method 201 that may be employed in only a single cycle PV operation or, if desired, to each multiple cycles in a state change operation. In the case where it is desired to program memory cells (e.g., a NAND flash), a "page" of cells is processed simultaneously until every cell in the "page" has the desired contents (i.e., "logic 0" or "logic 1"). In the case of a NAND flash erase operation, an entire block (i.e., a matrix consisting a series of wordlines and matching strings that couple to the same substrate well) is processed until every cell in the block possesses a reset state (i.e., a "logic 1"). As indicated by numeral 203, a pulse is applied to a memory cell as part of the program portion of a single cycle PV operation by first coupling a channel associated with a cell to be programmed to a first voltage reference, for example, to $V_{cc}$. To cause current to flow across a page or block of selected memory cells as desired, the associated wordline or wordlines are coupled to a second, different voltage reference, (e.g., "$V_{pgm}$") as indicated by reference numeral 205. Then, with the wordline or wordlines held at this voltage, the channels for each cell to be programmed are pulsed to third voltage reference (e.g., to ground) for a brief period in order to pulse voltage across the cell. Any set of voltages may be used as appropriate to cause current to flow across the cell. As indicated by numeral 207, the coupling of a substrate channel to its associated reference used to cause current to flow across the cell (e.g., to the third reference, such as ground) is then pulsed in order to apply the program portion of the cycle. That is to say, the program pulse is effectively applied as a series of individual control pulses or "micropulses" to couple and decouple the substrate channel from its reference, and once an appropriate number of these pulses have been applied, the program portion terminates. The memory cell contents may then, if desired, be verified.

Figure 3:
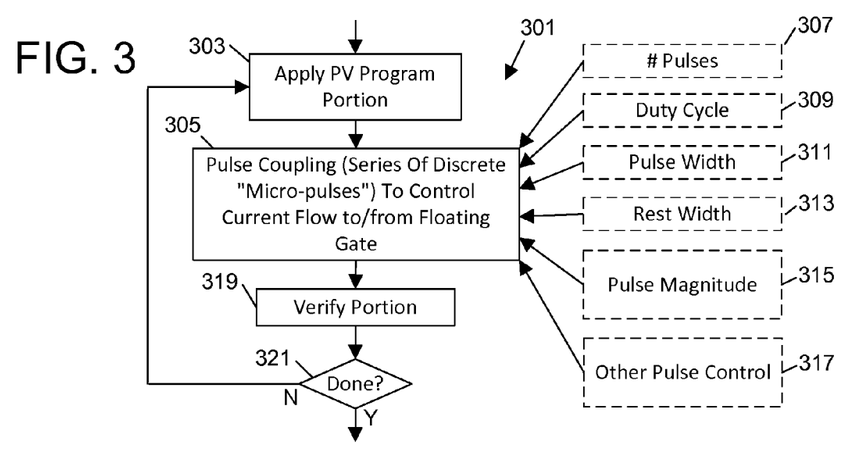

FIG. 3 presents a block diagram 301 that provides additional detail on this operation, implemented as part of the program portion of a multiple-cycle PV operation. In particular, each cycle begins with application of the program or pulse portion, during which voltage is applied across the memory cell in order to transfer charge to or from a floating gate by Fowler-Nordheim tunneling (in the case of a flash memory cell), as indicated by reference numeral 303. Whereas a single, fixed voltage pulse would conventionally be applied for an interval sufficient to transfer a desired amount of charge to or from the floating gate (e.g., a microsecond pulse), step 305 calls for administering these pulses as a series of discrete pulses ("micropulses") through bitline control. As indicated by a series of dashed line boxes 307-317 at the right-hand side of FIG. 3, these pulses may be defined by or controlled by any desired criteria. For example, the number of pulses may be specified, per block 307, as may the duty cycle of each pulse, as indicated by numeral 309. If desired, pulse width or duration may also be specified, per block 311 (e.g., "20 nanoseconds"). In some embodiments, pulse magnitude or other information may be provided as part of this "pulse control information." There also exist a number of vehicles for defining this pulse control information. For example, pulse control information may be built into the design of a particular system or may be made adjustable or programmable at the factory (for example, by fixing a value, blowing a fuse, or some other mechanism). Still further, in some embodiments, a configuration routine may be executed during device operation in order to program calibrated values into a device register, for use during run-time; if desired, such a routine may be repeated, or updated for temperature or other sources of drift or for other run-time variations. Once the appropriate amount of charge has been transferred, the method then proceeds to the verify portion of the PV operation, and additional cycles are repeated as necessary, as indicated by numerals 319 and 321. As mentioned previously, for a flash memory embodiment, additional PV cycles may involve progressively higher voltages up to a limit, and may involve single or multiple level memory cells.

Figure 4:
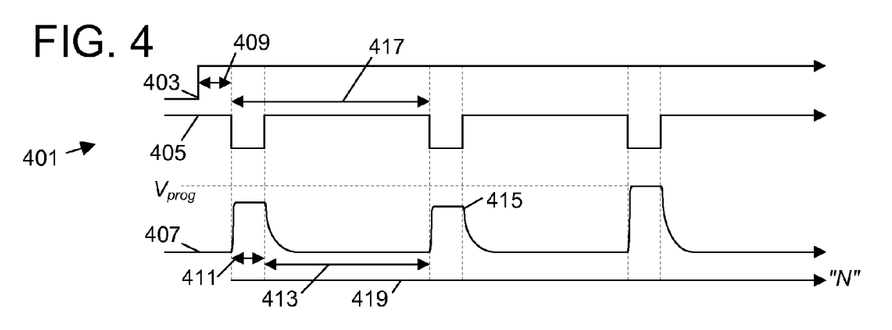

FIG. 4 presents a timing diagram 401 used to illustrate one possible operation of the method of FIG. 4, and shows three voltage waveforms. A first waveform 403 represents a logic signal used to gate the application of one reference voltage to the wordline, while a second waveform 405 represents pulsed bitline control that is used to pulse a substrate channel between another reference voltage and yet another, third reference voltage. As mentioned previously, the relationship between wordline and channel voltages are such that a first polarity is effectively applied to set (or "program") the memory cell, while a second polarity is effectively applied to reset (or "erase") the memory cell. A third waveform 407 represents the actual application of voltage across the memory (i.e., across the floating gate in the case of a NAND flash cell), such that the voltage difference corresponds to a voltage used for programming or erasing; in the context of the embodiment described in FIG. 1, above, the voltage drop across the dielectric will be such that approximately half of the voltage drop will be between the control gate and the floating gate and the bulk of the remainder of the voltage drop will be between the control gate and the substrate. Generally speaking, it is generally desirable to have each "on" state of the substrate channel be effective to create a voltage drop and, to this effect, the wordline may be coupled to the first reference voltage a predetermined amount of time 409 before the corresponding channel for a cell to be programmed is brought low. The bitline control is pulsed "on" (i.e., to bring the channel low by connecting it to the third reference voltage, such as ground) for a duration of time identified by reference numeral 411, which quickly creates a voltage difference between the wordline and the channel and causes current to flow. The effective voltage drop is represented by the third waveform 407, which indicates that the voltage difference quickly rises to "$V_{prog}$" as the bitline is pulsed "on" (e.g., by turning "on" a transistor associated with one of point "B" to tie the associated substrate channel to ground) and then quickly decays to $V_{prog}-(V_{cc}-V_{th})$ as the substrate is electrically isolated as the bitline is pulsed "off." The affected cell(s) is (are) then allowed to anneal or rest during a rest period 413, prior to the application of an ensuing pulse 415, and each repeated pulse may be applied with a period (or frequency) represented by numeral 417. During this period, the wordline voltage continues to be applied, but it is the bitline that is effectively pulsed "off" to allow the voltage drop across the cell to decay for purposes of annealing. The pulse duration 411 is selected to be an appropriate duration that, in view of the applied voltage drops, does not promote rapid precursor progression, and the rest period is selected relative to precursor progression to be "long enough" so that defects do not arise and become permanent during the entire program portion (represented by numeral 419). As indicated by the variable "N," seen at the right-hand side of FIG. 4, a series of N pulses is applied, where the cumulative transferred charge would be roughly equivalent to charge conventionally transferred via a single, uninterrupted pulse.

Figure 5:
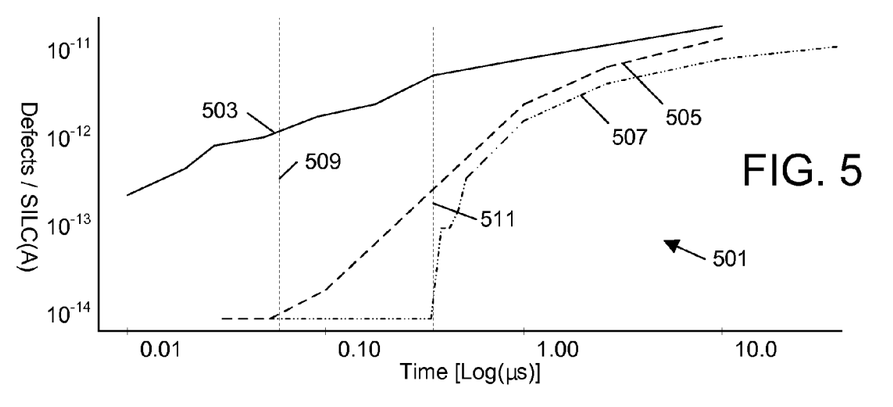
FIG. 5 is a timing diagram that shows defects generated for three different curves, as a function of voltage pulse period. A first curve 503 represents a ten volt difference (10 VDC) between a floating gate and a substrate channel, while second and third curves 505 and 507 represent 9 VDC and 8 VDC differences, respectively. As indicated in FIG. 5 by reference numerals 509, 511 and 513, depending upon the voltage used, shorter pulse periods generally result in smaller defect generation.

FIG. 5 presents a timing diagram 501 that shows the effects of pulse voltage and duration upon defect (e.g., trap) formation, expressed in terms of leakage current (SILC, measured in Amps). FIG. 5 shows three curves 503, 505 and 507, each associated respectively with 10, 9 and 8 VDC voltage drops, graphed against the logarithm of time. As seen in FIG. 5, the 10 VDC curve (numeral 503) demonstrates that leakage current is relatively small for short pulse periods (less than 0.01 microseconds, or equivalently, 10 nanoseconds) but that never quite disappears. By contrast, the 9 VDC curve (numeral 505) demonstrates substantial reduction in leakage current where program pulses are kept shorter than about 50 nanoseconds in duration, as represented by a vertical reference line 509. Finally, the 8 VDC curve (numeral 507) demonstrates even greater reduction in leakage current where program pulses are kept shorter than about 200 nanoseconds in duration, as represented by reference line 511.

FIG. 5 demonstrates that that for a given voltage difference, defect formation is reduced and substantially eliminated if program pulse time is kept "short enough" relative to applied voltage drop; it also shows that better results and greater flexibility may also be obtained by using relatively smaller voltage differences relative to conventional practice. Thus, FIG. 5 demonstrates that, contrary to conventional wisdom to emphasize high voltages and short programming times, reliability may be enhanced through smaller voltage differences and constrained voltage pulse times (with longer overall programming times). As mentioned previously, this result is difficult to achieve through wordline control, and bitline control is effectively applied by the embodiments of FIGS. 1-4 in order to obtain voltage pulses "fast enough" to obtain the benefits represented by the data of FIG. 5.

Figure 6:
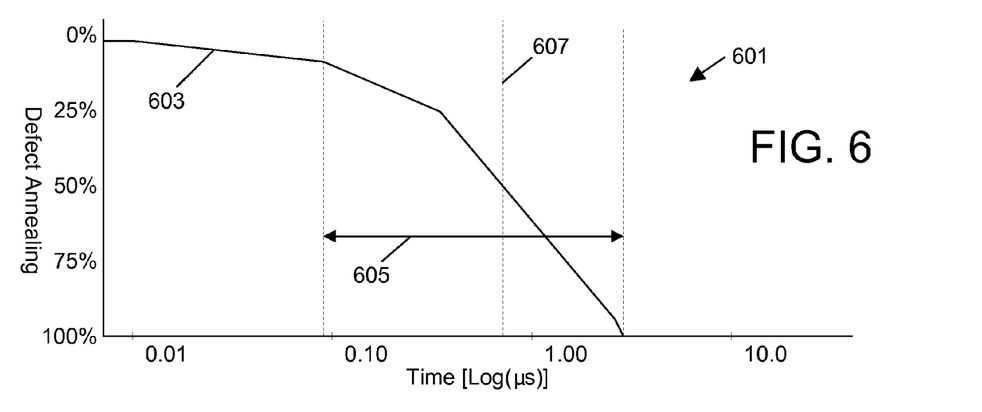
FIG. 6 is a timing diagram similar to FIG. 5, but which represents annealing of defect precursors as a function of the rest period between successive pulses. As represented by FIG. 6, using an applied voltage of 10 VDC as a norm, defect generation may be substantially reduced using the pulsing scheme represented by FIG. 5 relative to a "conventional," relatively long, single pulse. As indicated by vertical reference lines and associated range 605, annealing of defect precursors becomes significant in the rest period range of approximately 100 nanoseconds to 2 microseconds, with defect formation substantially disappearing above about 2 microseconds. As indicated by a vertical reference line 607, defect annealing becomes predominant for rest periods of about 800-1000 nanoseconds. For higher voltage differences, a longer rest period may need to be used, and for voltage differences of less than 10 VDC, a shorter rest period may be used.

FIG. 6 presents a timing diagram 601, which is similar to FIG. 5, but plots the effects of variation of the "rest period" (where the bitline is turned "off") for discrete pulses of a fixed voltage, e.g., 10 VDC. In particular, a curve 603 represents the reduction of defects as the "rest period" becomes longer. The curve demonstrates that for a voltage difference of 10 VDC, "rest periods" of more than 100 nanoseconds (0.10 microseconds) begins to yield demonstrable improvement, which continues throughout the range 605 of 100 nanoseconds to approximately 2 microseconds. Defect reduction becomes substantial for rest periods greater than about 500 nanoseconds. As indicated by reference numeral 607, defect formation may be reduced by more than 50% for "rest periods" on the order of 1 microsecond or longer (e.g., greater than about 800 nanoseconds for the example of 10 VDC).

It should be understood that the data represented in FIGS. 5 and 6 represent only one dielectric having a specific materials composition and thickness (e.g., 9 nm Titanium Oxide thickness) and that voltage difference, duration and rest period may be tailored by one skilled in the art to have appropriate values, depending on memory device type, materials and effective oxide thickness, and other factors.

Figure 7:
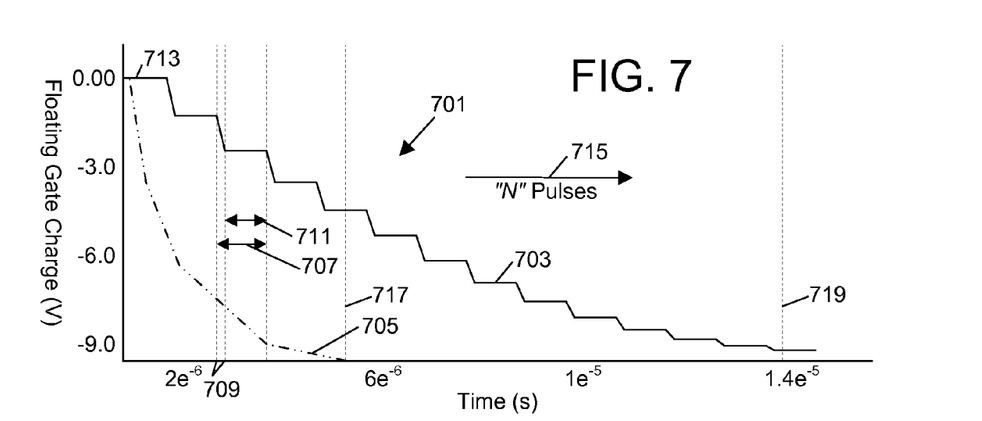
FIG. 7 is a timing diagram that illustrates the effect of pulsed bitline control as applied to relative charge of a floating gate.

FIG. 7 presents another timing diagram 701 that shows pulsed application of a voltage difference using bitline control and its effects on overall programming time, for a 9 mm Titanium Oxide dielectric. In particular, floating gate charge is illustrated by a staircase pattern 703 and is contrasted with a curve 705 of current decay pattern associated with a single voltage pulse. In particular, the staircase pattern 703 is obtained by the use of a pulse period 707 that consists of relatively short voltage pulse duration 709 and a relatively long rest period 711, of about 200 nanoseconds and one microsecond, respectively. As was alluded to earlier, the "rest period" is effectively applied first in each cycle (e.g., per numeral 713) such that a wordline or other control surface may be charged in preparation for a voltage pulse imparted by bitline control. As indicated by numeral 715, a series of "N" steps (i.e., discrete pulses) may be applied until the appropriate amount of charge has been transferred (or cumulative current flow has been obtained); in the example presented by FIG. 7, this charge is seen to correspond with a floating gate charge of approximately −9 VDC (that is, difference between a substrate and a floating gate in a NAND flash memory device, expressed as a negative voltage difference since FIG. 7 represents charge of the floating gate relative to the control gate). In this example, a voltage of approximately 18 VDC would have been applied to a control gate of a NAND flash memory cell, with approximately half of the ultimate voltage drop obtained between the control gate and the floating gate, and the remainder of approximately 9 VDC dropped between the floating gate and the substrate. As depicted in FIG. 7, whereas a single pulse might take on the order of 4-5 microseconds to substantially charge the floating gate, bitline control with appropriate "rest periods" between pulses may require a longer overall programming time (e.g., on the order of between 14-15 microseconds. The relative charging periods are respectively indicated by numeral 717 (in the case of the single, indivisible pulse 705) and 719 (in the case of the staircase pattern 703).

B. Implementation as a Flash Memory Device.

Figure 8:
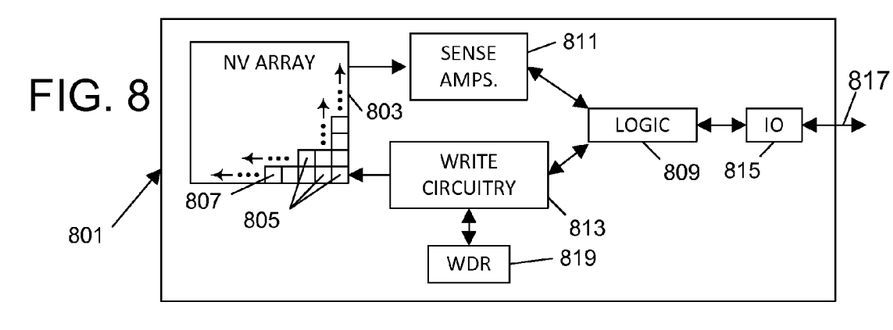
FIG. 8 is a block diagram of an exemplary flash memory device 801.

FIG. 8 is a block diagram of a flash memory device 801, used in part to explain PV cycle operation. In particular, the device includes a nonvolatile memory array 803, consisting of a great many individual memory cells 805. The cells may be configured as single level cells or multi-level cells. One particular cell, singled out for discussion, is indicated by reference numeral 807. As with all cells in the array, the erasing and programming of the cell 807 is controlled by device logic 809, which uses a sense amplifier 811 to detect memory cell values (one page at a time), and write circuitry 813 to program values into the array (again, one page at a time). The memory device 801 may be implemented as a discrete integrated circuit or as a multiple component device.

Programming generally can only occur after all cells that are to be changed in state have been erased, so typically an entire block associated with a page that is to be programmed is first erased; it should be assumed that this block includes the entire array of memory cells serviced by any one of a small set of word lines and their associated strings, e.g., strings of 16 cells serviced by sixteen word lines, in parallel. In order to perform this erasing operation, the substrate well (e.g., via each associated bitline or independently of the bitlines) is brought to "$V_{erase}$" and all associated wordlines are coupled to ground, so as to reverse bias and effectively discharge all effected floating gates. As each wordline is grounded the substrate well associated with the block is then strapped to a positive voltage, "$V_{erase}$," to perform the discharge.

Importantly, as will be described below, pulsed control (to permit defects to heal) may also be applied to erasing of a memory array—that is to say, pulsed control may also be applied independent of the bitlines to charge the substrate well (e.g., pulsing of the connection of the substrate well to "$V_{erase}$") or to the wordline (e.g., pulsing of the connection between the wordline to ground) or in another manner. Otherwise stated, to prolong device lifetime, pulsed control may be applied not only to the programming of cells, but also to the erasing of cells, any forming or "conditioning" operations applied to the cells, or to other application of voltage.

Irrespective of the erasing methodology, to program a page, a memory controller first transfers a page of data to an IO cache 815 over a data bus connection 817, and this data is then transferred into a write data register 819. The programming operation is similar to that described above for erasing, except that programming occurs for one page at a time (instead of a block) and except that state change is verified by comparing memory cell contents to an array of desired values (i.e., values in the write data register 819 that may be "logic 0" or "logic 1" instead of just a universal, single "reset" value). A first PV cycle is applied to the affected wordline using a minimum voltage for the first cycle (this voltage for the first PV cycle conventionally may be on the order of 18 VDC). In the manner described in connection with FIG. 1, each bitline is held low or raised to a nominal voltage ("$V_{CC}$") so as to permit transfer of charge from the control gate to a floating gate for each memory cell that is to be programmed but to inhibit transfer of charge for each memory cell that is not to be programmed. For those cells that are to be "set" (i.e., to have a value programmed into them that differs from the "logic 1" erased state), the substrate channel is coupled to ground, such that charge is allowed to build in the floating gate. Bitline control is applied by pulsing this coupling "on" and "off" in succession in order to pulse the voltage difference across the floating gate and in order to permit anneal time to the affected memory cell oxide layer. Following the pulse of the program portion of a PV cycle, device logic 809 then performs the cycle's verify portion—the logic 809 reads the sense amplifier 811 and performs an "exclusive-OR" operation with write data register contents, overwriting write data register contents with the result of the "exclusive-OR operation." Following conclusion of the particular PV cycle, the write data register contents will indicate those memory cells for a particular page that must be again attempted to be programmed i.e., "set," during a subsequent PV cycle, because they have not yet been properly set. The PV cycle sequence is then repeated as necessary. As mentioned above, the device logic 809 alerts the controller when programming is complete or in the event of an error.

Figure 9:
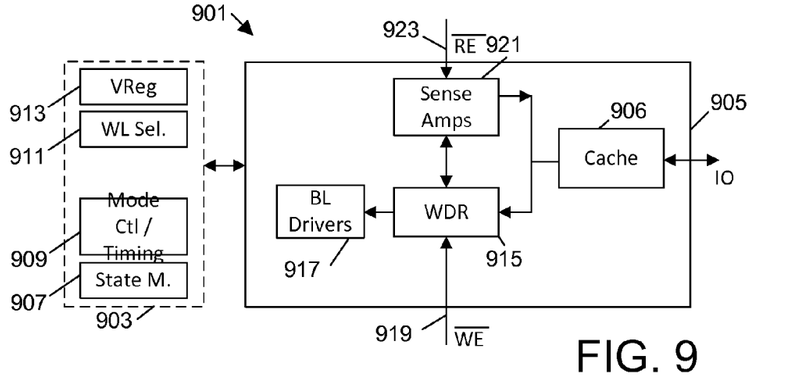
FIG. 9 is a block diagram that shows bitline control circuitry associated with elements of a flash memory device.

FIG. 9 presents block diagram 901 of one implementation of to bitline control in a flash memory device. In particular, two basic elements are illustrated in FIG. 9, including control logic 903 and a page buffer 905; the memory array itself is not illustrated so as to explain some of the control functions associated with the device. The control logic handles functions associated with switching, voltage control and associated timing for the memory array; these functions are illustrated by several logic blocks in FIG. 9. This control logic is generically connected to the device (e.g., to supply a write data register ("WDR") 915, bitline drivers 917 and sense amplifiers 921), though it should be understood that individual logic elements depicted (designated by numerals 907, 909, 911 and 913) may in fact electrically connect to and control only specific elements within the device, e.g., to the memory array, sense amplifier, WDR, or only to other logic elements. A state machine 907 is used to track the success or failure of a current PV cycle and also whether a time-out (excessive number of cycles has been reached). A mode control and timing block 909 is responsible for determining whether a programming or erase operation is in progress and, as appropriate, making decisions as to the particular voltages that should be generated and distributed for use by wordlines or bitlines, and associated pulse durations. Pulse duration and associated timing issues, as will be discussed below, may be handled in a centralized manner (e.g., common distribution of pulsed voltages) or in a distributed manner (e.g., distribution of a duty cycle signal with local high voltage switching for each wordline, channel or well locally performed, as appropriate). In at least some embodiments (as will be discussed below), the use of localized control may be used to help minimize routing length and thus RC loading, allowing for faster pulse rise times. That is to say, by shortening routing length associated with driving a bitline, rise times may be made "short" relative to the desired goal of being able to generate programming pulses of less than 50 nanoseconds. In at least one embodiment, the routing is designed so as to generate 2RC rise times of less than 16 nanoseconds, and in a second embodiment, the routing is designed so as to generate 2RC rise times of no more than 8 nanoseconds. The mode control and timing block 909 may also be used to selective enable or disable bitline control (or other pulsing control), to support selective use of a reliability mode or a high performance mode. In a reliability mode, the nonvolatile memory device may be operated with pulse control to apply state change voltages, to enhance device longevity, in the manner described above. In the performance mode, the pulse control can be turned "off," with conventional voltage application used to minimize the time associated with state change operations.

The mode control and timing block 909 also generates write enable and read enable signals 919 and 923. Bitline drivers 917 provide multiplexed control to each of the pertinent bitlines, so that every memory cell in a page being programmed (e.g., corresponding to a selected wordline) may be individually "set" (i.e., programmed), as appropriate. These bitline drivers control the pulsing of voltage references (for each string undergoing programming). Alternatives for applying bitline control include, among others, pulsing a commonly distributed enable signal, centrally distributing a pulsed voltage reference, and generating pulses locally within each bitline using appropriate bitline control circuitry. These alternatives are not the only options available to a skilled designer. The control logic 903 also includes a wordline select block 911 that is responsible for generating an address and enable signal for each wordline when it is desired to program or read the associated wordline. A voltage regulation block 913 is also used by the control logic to generate and distribute voltages needed for device program (set) or erase (reset) operations.

The page buffer 905 typically consists of an internal data cache 906 used to hold pages of data being transferred in or out of the memory device, the write data register 915 and the sense amplifier circuitry 921. When it is desired to write data, a page of data is loaded from the cache into the write data register 915, and the control logic attempts to program the memory array (not seen in FIG. 9) using the program portion a PV cycle; the write enable signal 919 is asserted for this purpose. During each verify portion of a PV cycle, the write enable signal is de-asserted by the control logic and the read enable signal 923 is lowered to cause the sense amplifier circuit to check memory contents and to "exclusive or" memory contents with the contents of the write data register, in effect, overwriting the write data register. The write data register will then represent only "differences" between current memory contents and the desired page of data. Simultaneously, the state machine 907 is updated to reflect whether additional PV cycles are necessary or whether a maximum number of PV cycles, or a timeout, has been reached. When it is desired to erase (reset) data, an entire block of memory is processed at a time, and the state machine is used simply to identify whether any memory cells in a block have not been reset to a logic high state.

C. Wordline and Bitline Management.

Figure 10A:
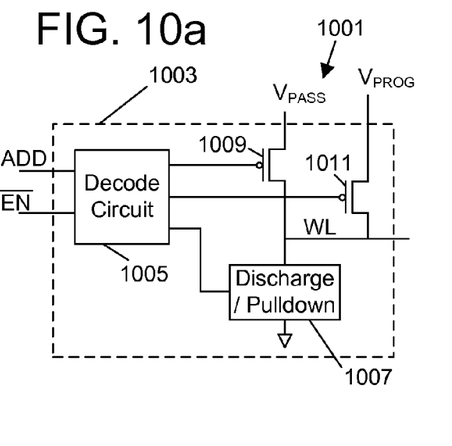
FIG. 10a is a block diagram of a wordline driver 1001.

FIG. 10*a* is a block diagram of one embodiment of a wordline driver 1001, implemented as a individual circuit 1003 dedicated to each wordline. In particular the wordline driver includes a decode circuit 1005, a discharge/pulldown circuit 1007, and two control transistors 1009 and 1011. The decode circuit determines the voltage to be applied to each wordline and, for this purpose, receives as inputs an enable signal and wordline address (each respectively denoted by the acronyms "EN" and "ADD"). The discharge/pulldown circuit is used when it is desired to couple the corresponding wordline to ground (e.g., during an erase operation), and the control transistors 1009 and 1011 are respectively used when it is desired to couple the wordline to one of two voltages, "$V_{pass}$" or "$V_{prog}$," respectively. "$V_{pass}$" is used as a nominal voltage for each "unselected" wordline during a programming operation (i.e., when a different memory cell within the string or bitline is being programmed or "set"). The voltage "$V_{prog}$" is used to apply a higher voltage to the memory cell that is the subject of programming. Thus, the purpose of the decode circuit for each wordline driver is to control the application of the appropriate voltage reference to the associated wordline. In connection with the operation described earlier, "$V_{prog}$" may be separately defined for each PV cycle by controlling the charge pump (not seen in FIG. 10a) to generate a desired voltage. In addition, during a read operation, either "$V_{pass}$" or "$V_{prog}$" may be scaled by a suitable voltage regulator to be equal to a threshold voltage, associated with the midpoint between voltages associated with two alternate logic states that are to be discriminated.

Figure 10B:
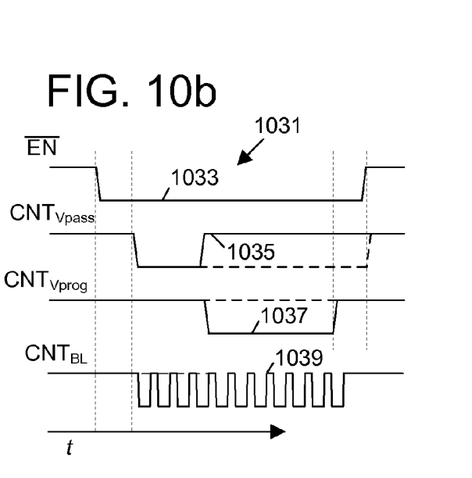
FIG. 10b is a timing diagram used to explain a manner of controlling the circuit of 10a, so as to program a flash memory cell.

FIG. 10b is a timing diagram 1031 used to explain a manner of controlling the circuit of FIG. 10a, so as to program a flash memory cell. In particular, a first waveform 1033 represents the timing of an enable signal, while second and third waveforms 1035 and 1037 represent timing signals used to control the transistors 1009 and 1011 from FIG. 10a. When it is desired to charge a wordline, the enable signal is first activated; this activation, a short time later, causes the decode circuit to turn "on" the first transistor 1009, to apply "$V_{pass}$" to the wordline "WL." The value of "$V_{pass}$" is selected by the circuit designer, to carefully balance the risk of unintended floating gate discharge against unintended charging of unselected cells, but typically is a value of about 9-10 VDC. All wordlines of a page where memory cells are being programmed are thereby raised to "$V_{pass}$." If it is intended to program a particular memory cell, then the address value "ADD" is used to cause the decode circuit for the particular wordline to turn "off" the first transistor and immediately turn "on" the second transistor 1011, to raise the control gate of the particular memory cell being programmed from "$V_{pass}$" to "$V_{prog}$." Notably, if the wordline driver is being used to control an "unselected" wordline (i.e., one not the subject of programming), then the second waveform 1035 is held low for the duration of the enable signal (as depicted by a dashed line) and the third waveform 1037 is maintained high, i.e., to not turn "on" the second transistor 1011 of the wordline driver, as also indicated by a dashed line. Bitline control is effectively represented by a fourth waveform 1039, which shows pulsed control at a frequency much faster than the wordline switching to effectively modulate the voltage difference existing between the wordline and a matching bitline (for a particular memory cell). As indicated by dashed lines just above the initial pulses for the fourth waveform in FIG. 10b, the pulsed bitline control may be applied (a) only for programming voltages, (e.g., only for the transition from "$V_{pass}$" to "$V_{prog}$") (b) anytime a voltage is applied to a corresponding wordline (e.g., "$V_{pass}$" or "$V_{prog}$"), such as for a state change operation, or (c) only for pass voltages (e.g., for the transition from zero volts to "$V_{pass}$"). Generally speaking, it is expected the best results in terms of device lifetime enhancement will be obtained where pulsed bitline control is always applied in conjunction with wordline voltage changes, but design considerations for particular designs or applications may cause a designer to apply bitline control only for select operations; for example, in the depicted embodiment, pulsed bitline control is applied only for programming voltages.

Figure 10C:
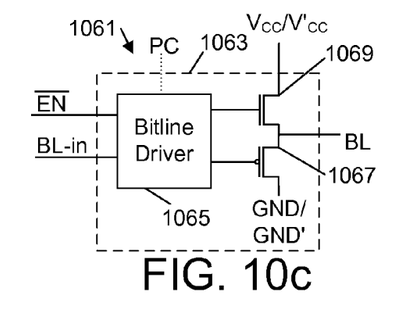
FIG. 10c shows a bitline driver circuit 1061 as one way of pulsing current across a memory cell element.

FIG. 10c shows an embodiment of a bitline driver 1061, which may be implemented as a tristate device dedicated to each bitline of a memory array. This circuit 1061 also includes a bitline pulse control mechanism 1065 and bitline-in and bitline enable inputs, used to trigger operation of pulsed control. The bitline pulse control mechanism, in turn, controls two transistors 1067 and 1069. The bitline pulse control mechanism represents a tristate device in the sense that control over the two transistors 1067 and 1069 can be separately established, meaning that each bitline can be turned "off," and can also be selectively coupled to either a selected voltage "$V_{CC}$" or ground. As was mentioned earlier, alternatives for pulsed control methods include (a) active control over the enable signal "EN," (b) use of a dedicated pulse control signal "PC" (either to supply a "live" control signal or to program values into registers internal to each decode circuit), and (c) provision of a pulsed supply or ground connection (e.g., "$V'_{CC}$" and "GND"). Other alternatives will also be apparent to those having ordinary skill in the art. As indicated in FIG. 10c, the output "BL" effectively pulses the connection of a substrate channel to a second voltage reference so as to establish a voltage pulse across a memory cell, again, with desired pulse magnitude, duration and rest period characteristics, in a manner ideally not subject to detrimental RC loading characteristics.

Figure 11:
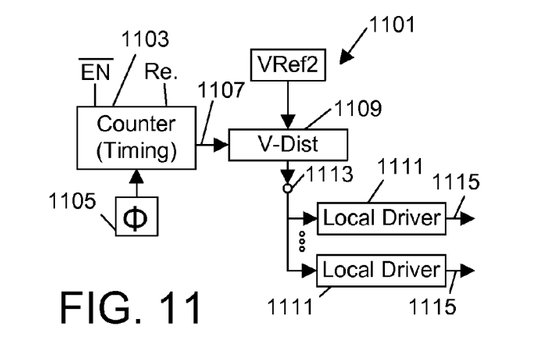
FIG. 11 shows an embodiment where bitline control is performed using local segment drivers 1111, to reduce loading effects and thereby improve pulse rise time.

FIG. 11 shows a schematic where bitline control is used to partition a bitline and locally drive individual bitline segments based upon a centrally-distributed power supply 1101. In particular, one or more counters, clock multipliers or other forms of timing circuitry 1103 are used to derive timing for "on" and "off" timing for bitline control from a base clock 1105. Generated timing pulses 1107 are then fed through voltage distribution system 1109 to localized segment drivers 1111. As indicated in FIG. 11, one or more centrally-generated voltage references (e.g., $V_{cc}$ and ground, as appropriate) may be distributed from a common power distribution node 1113 to the individual segment drivers 1111. Each segment driver also receives a bitline select signal, which indicates if associated bitlines are to be the subject of programming. Each localized driver may be implemented as simply as a tristate device, controlled in response to the timing pulses 1107. Thus, the localized drivers 1111 in this embodiment may pulse the interconnection between this node and the pertinent voltage supply in a manner that minimizes RC loading, i.e., the output of each segment driver 1115 is insulated from loading effects "upstream" from the pertinent local driver 1111. Because loading effects (and slowness of rise time) are RC-proportional, with each of resistance and capacitance being linear with routing length, halving the length of trace length associated with bitline control creates an approximate four-fold improvement in rise time. Each output 1115 may then be fed to the associated strings and used as the bitline enable input seen in FIG. 10c.

To provide one example of an application of the circuitry of FIG. 11, one recently introduced flash memory device has an 8 GB capacity with a bitline 2RC rise time of approximately 266 nanoseconds. This time may be too long to be able to effectively use bitline control alone to generate voltage pulses of 50 nanoseconds or less using bitline control. However, by driving bitlines in a segmented manner, for example, by partitioning the bitline into four "local" segments and using a separate driver for each, a sixteen-fold decrease in rise time may be achieved (i.e., to approximately 16-17 nanoseconds), which is short enough to generate robust pulses of less than 50 nanoseconds. As mentioned elsewhere herein, it is desired for some applications to generate robust pulses of 20 nanoseconds duration and generally speaking, these principles call for a 2RC rise time of no more than approximately 8 nanoseconds, shorter if possible. By further subdividing the bitline, e.g., into six local bitlines, rise time may be further improved, e.g., to 266/(6^2) or to about 7.4 nanoseconds in this example.

D. Forming Voltages.

The discussion above has primarily focused on pulsed bitline control as a run-time means of enhancing device lifetime. However, certain types of memory devices may also be damaged during the application of forming voltages or other conditioning events to prepare devices for first use. For example, certain types of nonvolatile memory devices must be set or reset for the very first time using a larger-than-typical voltage, to effectively condition the state change mechanism of the memory cell for a repeatable operation with consistent voltages. Because larger-than-normal currents or longer-than-normal currents may flow through memory cells during these "conditioning events," the memory cells are even more susceptible to the formation of undesired defects. The bitline control principles mentioned above may be applied with similar effect during the conditioning of memory devices and, in fact, there may be some embodiments where pulsed bitline control is used only during factory conditioning (e.g., because of the use of larger- or longer-than-normal currents).

III. EXTENSION OF PULSE CONTROL PRINCIPLES TO OTHER CONDUCTORS

The embodiments discussed above rely on bitline control because bitlines are often implemented via an all metal conductor (e.g., tungsten, copper, etc.) and typically are not encumbered by high loading associated with connections to transistor gates. To provide a comparative example, conventional wordline design typically uses a polysilicon material for the wordline, and each wordline in turn is coupled to literally thousands of transistor gates; in some implementations, bitlines and associated strings are interleaved, meaning that a device having a 4,096 byte page may effectively have wordlines each connected to 65,536 memory cells (assuming a 2:1 interleave ratio, with 8 bits or memory cells per byte). These issues make it more difficult to use wordline control to generate robust voltage pulses, but wordline control is nevertheless possible.

Figure 12:
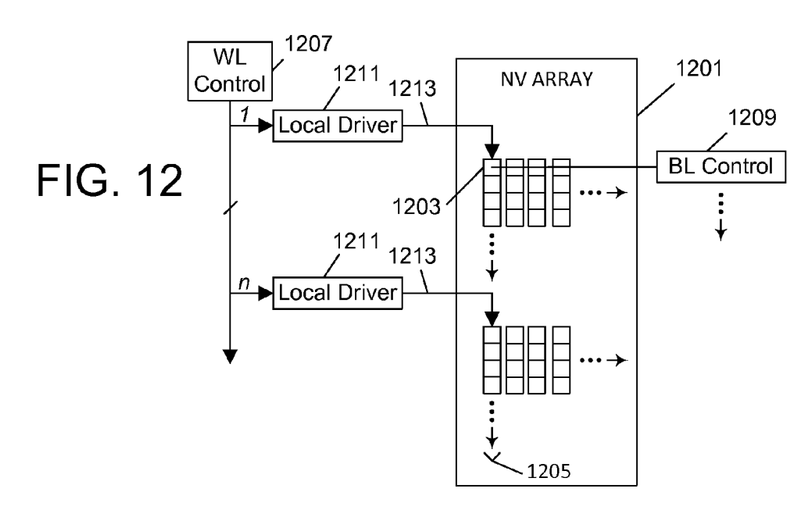
FIG. 12 shows an embodiment where wordline control is performed using local or segmented drivers 1211 to partition a wordline and thereby reduce loading effects and improve pulse rise time.

FIG. 12 illustrates an embodiment where wordline control is used, with each logical page segmented into plural wordlines. For example, whereas one wordline might be conventionally used for two interleaved pages (as in the example presented in the last paragraph), in the example of FIG. 12, each page may be implemented using plural wordlines (or equivalently articulated, using a set of wordline drivers to reduce RC loading experience in delivering a voltage pulse to each control gate associated with a page of memory cells).

A nonvolatile memory array 1201 is seen to include a number of individual memory cells arranged in columns 1205 that each represents an individual page. For example, in an embodiment where page length is 4,096 bytes, a column might be associated with 65,536 memory cells as just described, all managed as a single logical page (as represented by wordline control block 1207). To simplify FIG. 12, only a single page is designated by a number, as represented by numeral 1205, but it should be understood that a great many pages exist in parallel, as represented by ellipses and arrows at the right side of the NV array depicted in FIG. 12. Similarly, the matrix of cells represented by this array is accessed by a large number of bitlines, arranged as rows in the array, as typified by a single bitline control block 1209, seen at the right-hand side of FIG. 12. A hypothetical 8 GB device might conventionally have a rise time of around 1 microsecond. In order to reduce such a rise time to less than 8 nanoseconds (e.g., to generate a robust voltage pulse of 20 nanosecond), the control principles discussed above in the case of bitline control would call for subdividing the wordline into a smaller number of locally driven wordlines, each wordline having an effective length of "L/n," where L represents a normalized wordline length and "n" representing the number of divisions (or local drivers needed to reduce loading). Since the loading effects and associated rise time are reduced by a factor of "n^2," wordline length in this example should be reduced by at least a factor of 12 (6.94 ns rise time). FIG. 12 indicates such a division, with wordline control being split into a number of local segment drivers 1211, each driving a segment of substantially smaller length than represented by page length. Each local driver, in turn, may be identical to the wordline driver depicted by FIG. 10a.

An advantage of wordline control is that the same control mechanism can be used for both programming and erasing operations, e.g., the wordline can be pulsed in connection to each of "$V_{pgm}$," "$V_{pass}$" and ground to effectively provide precursor annealing for (a) selected pages that are subject to a state change operation, (b) unselected wordlines that are in parallel with a page undergoing programming and (c) substrate well charging associated with an erase operation. In this latter example, the wordline can be pulsed in its connection to ground while the substrate well is charged to "$V_{erase}$," using principles similar to those described above for bitline control.

As should be seen from this example, the application of a series of voltage pulses using wordline control is possible, but typically requires a number larger amount of division (and associated driver circuitry) than achieved through bitline control.

Figure 13:
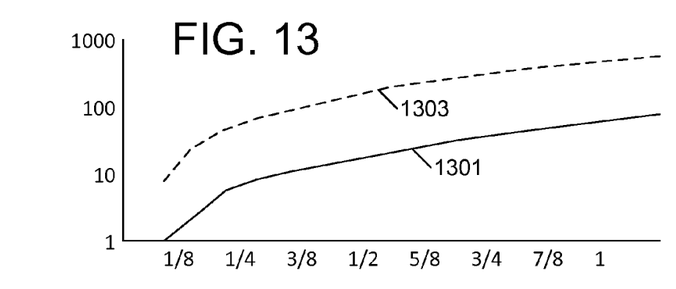
FIG. 13 presents a graph of rise time associated with conductor length scaling for a 8 GB, 43 nm flash memory device. A first (solid line) curve 1301 represents bitline 2RC rise time, while a second (dashed line) curve 1303 represents wordline 2RC rise time. By scaling conductor length and applying pulse control in the manner discussed by this disclosure, voltage pulses and associated rest periods may be applied to anneal precursors before they generate any substantial oxide layer damage.

FIG. 13 presents a graph showing 2RC rise time for a 43 nanometer, 8 GB device, with the vertical axis representing a logarithmic scale of nanoseconds and the horizontal axis representing the amount of control line length subdivision. A first (solid line) curve 1301 represents bitline rise time in this example, whereas a second (dashed-line) curve 1303 represents wordline rise time. For example, the value of "1" on the horizontal axis (representing no wordline or bitline division) indicates that for the un-subdivided 43 nm device, wordline rise time is on the order of one microsecond and bitline rise time is on the order of 266 nanoseconds. As indicated by the value of ⅛ on the horizontal axis, by subdividing the wordline and bitline length each by eight, these rise times fall to approximately 16 and 7 nanoseconds, respectively.

Figure 14:
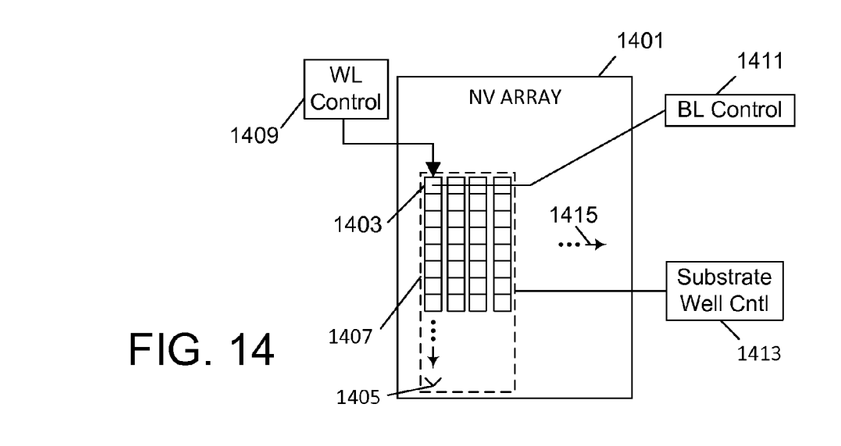
FIG. 14 shows an embodiment where pulse control is applied to substrate well charging.

As alluded to earlier, wordlines and bitlines are not the only conductors that can benefit from the teachings presented above, and the teachings presented above may also be otherwise extended to substrate well charging in connection with an erase operation. These principles are illustrated by FIG. 14, which shows a nonvolatile memory array 1401, and a number of individual memory cells 1403 (only one is numbered to simplify description). In the example depicted by FIG. 14, each wordline is seen as controlling a single page 1405 of 'j' memory cells; although a large number of wordlines are present (e.g., thousands), only one wordline shown to simplify description. The wordline of FIG. 14 is longer than the wordline of FIG. 12, assuming conventional design, but the teachings of FIG. 12 may also be used in combination with the embodiment of FIG. 14 if desired. FIG. 14 also depicts in phantom lines a substrate well 1407, which is associated with a set of "k" wordlines in parallel, where "k" is string length and the substrate well is associated "jk" memory cells. Each wordline, in turn, is governed by a time-multiplexed wordline control block 1409, which applies voltage to the wordline as a unit (e.g., "$V_{pgm}$," "$V_{pass}$" or ground, as mentioned above). A single bitline control block 1411 is also indicated and gates an access transistor for each associated string so as to selectively program a single memory cell associated with the intersection of a particular wordline and a particular string coupled to the bitline. FIG. 14 presents a method of pulsing a substrate well that may be used independent of any bitline control.

It will be recalled from the discussion above that to erase a block of memory in NAND flash (e.g., represented those "jk" memory cells associated with the substrate well/erase block 1407), the substrate well is raised to "$V_{erase}$" while all associated wordlines are coupled to ground. In the example of FIG. 14, a substrate well control block 1413 may be used to pulse the connection of the substrate well to this voltage in order to provide pulsed control to retard precursor formation associated with an erase operation. That is to say, substrate loading can be managed to be even smaller than that used for conventional bitline design, and through appropriate design (e.g., minimizing trace length and associated RC coupling associated with substrate power application), an entire substrate well may be pulsed as a unit with appropriately short rise times. The circuit of FIG. 10c may be used for this purpose, except that in this case, a well select function would be used in lieu of address and bitline enable functions listed in FIG. 10c.

The use of pulse control during erase operations may also substantially deter defect formation by mitigating precursors, allowing them to anneal before they become permanent. These teachings may be used in lieu of, or in addition to, the teachings presented earlier.

IV. CONCLUSION

A method of programming a nonvolatile memory cell has been described, in a manner that pulses charging to limit the duration of current flows, associated electric fields, and formation of defect precursors. By applying programming or erasing in short, repeated pulse intervals, with a sufficient rest period in between pulses, it is believe that the defects that ultimately degrade nonvolatile memory and shorted device lifetime may be substantially reduced, in some cases, completely eliminated. Limiting the magnitude of voltage difference may also help anneal defect precursors. Voltage pulses of very short duration may be effectively generating, ideally enabling robust pulses shorter than 20-50 nanoseconds in duration, enabling nonvolatile memory devices to effectively implement precursor annealing.

By using specific circuits as part of the charge mechanisms for these memory cells, the control gates, substrate, and bitlines for each memory cell may have supplied power precisely regulated to as to reduce the damage caused by high electric fields. By limiting this damage and thus extending the expected lifetime of nonvolatile devices, it is hoped that the potential applications of these devices can be thereby extended, potentially to even eventually include main memory or other applications.

Various alternatives to the foregoing techniques will readily occur to those having skill in the art. For example, as mentioned, the described techniques can be implemented in other forms of devices, including other forms of nonvolatile memory. In addition, it is also possible to design memory cells so as to effectively apply pulsed control through the substrate, the wordlines (i.e., corresponding to a "page" or minimum programming unit) or through other conductors without departing from the teachings presented above. Other mechanisms for constraining electric field generation are also possible, including circuits and techniques other than the specific pulse control mechanisms presented above.

It should be noted that the various circuits disclosed above may be described using computer aided design tools and expressed (or represented), as data or instructions embodied in various machine-readable media (i.e., storage media recognizable by computers, such as in electronic memory, CD-ROM, DVD, optical, magnetic or other formats used to read data by machines). This data may be expressed in terms of their behavioral, register transfer, logic component, transistor, layout geometries, or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES. Other suitable formats and languages may also be used. When received within a machine such as a computer system, such data or instructions may be processed in connection with execution of one or more computer programs including, without limitation, net-list generation programs, place and route programs and the like, to generate a representation or image of a physical manifestation of such circuits. The representation or image may thereafter be used in device fabrication, for example, by enabling generation of one or more masks that are used to form various components of the circuits in a device fabrication process. In one embodiment, a circuit description is of a type that may be used in the direct control of integrated circuit forming devices (e.g., in automated control of fab equipment).

In addition, the description set forth above has also been couched in terms of devices that use PV cycles. It is also possible to apply the teachings presented above to devices that do not utilize PV cycles, or that use a different form of PV cycle operation than the methodology presented above. Importantly, for those devices that do use PV cycle operations, a wide variety of controller-memory device interchange formats exist, including formats where the memory device controls each PV cycle in a manner transparent to the controller, and formats where the controller manages the process and specifically commands each PV cycle, or commands each program and verify portion separately. In one embodiment, the teachings presented above may be applied to an embodiment where a memory device is compatible with legacy flash controllers, i.e., where a controller command for either a multi-cycle PV operation or for individual PV cycles is broken down within a memory device into individual voltage steps, ramps, or other power supply control operations, in a manner that is transparent to the controller. If desired, pulse control may be hardwired, calibrated, programmed or otherwise defined or effected. All such operations are contemplated as within the scope of this disclosure.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. The term "coupled" is used herein to express a direct connection as well as a connection through one or more intervening circuits or structures. The term "exemplary" is used to express an example, not a preference or requirement. Also, the verb "charge" and reference to "charging" expressed above should be understood to refer to current flow in either direction, i.e., current flow in the FIGS. and discussion may be expressed in terms of absolute magnitude or current, and may be driven using positive or negative voltages or current flows, or both, depending on implementation.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

We claim:

1. A method of changing state in memory cells of a nonvolatile memory device, where each memory cell has a floating gate, a first conductor and a second conductor, where each memory cell is to store charge on the floating gate according to a potential difference between the first conductor and the second conductor, to indicate a first state in the respective memory cell, and where data is to be programmed or erased in each memory cell using multiple program-verify cycles, each program-verify cycle comprising a program portion and a verify portion, the method comprising:

during the program portion of each program-verify cycle, repeatedly pulsing application of the potential difference between the first conductor and the second conductor, dependent on state of a corresponding bit line, to provide for a pulsed voltage drop across the memory cell dependent on the state of the corresponding bit line; and for each memory cell to which the pulsed voltage drop is to be provided, between each application of the potential difference, providing for a rest period;

where each pulse of the voltage drop has a duration of no greater than 100 nanoseconds.

2. The method of claim 1, where the second conductor is a channel and where the method further comprises, responsive to logic state of the corresponding bitline, pulsing the channel between a first voltage and a second voltage.

3. The method of claim 1, where repeatedly pulsing application of the potential difference comprises using an access transistor under the influence of a pulsed control signal to provide for the pulses of the voltage drop.

4. The method of claim 1, further comprising reading pulse control information from a register that is dynamically programmable, the pulse control information including at least two of: (a) pulse frequency, (b) duty cycle of pulsed application the potential difference relative to the rest period, and (c) number of pulses to be applied during each program portion.

5. The method of claim 1, further comprising reading mode information from a register, the mode information comprising a selective one of (i) a high reliability mode, in which a pulsing mechanism is selectively turned on, the pulsing mechanism to provide for the repeated pulsing of application of the potential difference between the first conductor and the second conductor, and (ii) a performance mode, in which the pulsing mechanism is turned off.

6. The method of claim 1, where repeatedly pulsing application includes repeatedly pulsing the second conductor between a first voltage and a second voltage during the program portion of each program-verify cycle, to thereby apply a plurality of pulses of the voltage drop, each pulse of the voltage drop having a duration of no greater than approximately 50 nanoseconds, the rest period between each adjacent pair of consecutive pulses of the voltage drop in the plurality being at least 500 nanoseconds.

7. The method of claim 6, where each pulse of the voltage drop has a duration of no greater than approximately 30 nanoseconds, and pulse frequency is no greater than approximately once every 800 nanoseconds.

8. The method of claim 1, where:

the second conductor comprises a channel coupled to a driver that is under control of the corresponding bitline; and repeatedly pulsing application comprises pulsing the driver on and off to sequentially generate pulses of the voltage drop during the program portion of each program-verify cycle, each pulse to provide an electrical connection between the channel and a programming voltage; and the method further comprises coupling multiple drivers to the corresponding bitline and segmenting the corresponding bitline into corresponding segments, each segment to couple a channel for at least one memory cell to the programming voltage.

9. The method of claim 1, where repeatedly pulsing application includes pulsing application of a programming voltage to a wordline, partitioning the wordline into multiple segments, employing multiple wordline drivers per logical page, at least one wordline driver per segment, and separately driving each the multiple segments.

10. A nonvolatile memory device in which programming of data is to be performed using program-verify cycles for each of plural memory cells, each program-verify cycle having a programming portion and a verify portion, the nonvolatile memory device comprising:

for each of the memory cells, a first conductor, a second conductor, a floating gate between the first conductor and the second conductor, and a bitline; and a pulsing mechanism to pulse application a voltage drop between the first conductor and the second conductor so as to store charge on the corresponding floating gate according to state of the corresponding bitline;

where, for those memory cells that are to receive pulsed application of the voltage drop according to the state of the corresponding bitline, the non-volatile memory device is to pulse application of the voltage drop repeatedly during each program portion and, in between each adjacent pair of pulses of the voltage drop, is to provide for a rest period; and where each pulse of the voltage drop has a duration of no greater than 100 nanoseconds.

11. The device of claim 10, where the device is a flash memory device.

12. The device of claim 11, where the pulsing mechanism includes an access transistor to control electrical connection of one of a wordline to a current source, or a channel to a current source, the access transistor to repeatedly pulse the electrical connection at a frequency that is no less than once per microsecond.

13. The device of claim 10, further comprising a register to store at least two of: (a) pulse frequency, (b) duty cycle of the pulse of the voltage drop relative to the rest period, and (c) number of pulses of the voltage drop to be applied during each program portion, the register being dynamically programmable by a remote memory controller.

14. The device of claim 10, where the device further comprises a register to store a mode setting, including a selective one of a (i) a high reliability mode setting, in which the pulsing mechanism is selectively turned on, and (ii) a performance mode setting, in which the pulsing mechanism is turned off, and where the register is programmable by a remote memory controller to define the mode setting.

15. The device of claim 10, where each pulse of the voltage drop has a duration of no greater than approximately 50 nanoseconds, and where the rest period between each pair of adjacent pulses of the voltage drop is at least 500 nanoseconds.

16. The device of claim 15, where each pulse of the voltage drop has a duration of no greater than approximately 30 nanoseconds, and pulse frequency is no greater than approximately once every 800 nanoseconds.

17. The device of claim 10, where for each memory cell to receive pulsed application of the voltage drop according to the state of the corresponding bitline, the pulsing mechanism is to pulse application of a programming voltage to a wordline.

18. The device of claim 10, where for each memory cell to receive pulsed application of the voltage drop according to the state of the corresponding bitline, the pulsing mechanism is to pulse a channel between first and second voltage references.

* * * * *